United States Patent [19]

Swan et al.

[11] Patent Number: 4,863,630

[45] Date of Patent: Sep. 5, 1989

[54] AZEOTROPE-LIKE COMPOSITIONS OF 1,1-DICHLORO-1-FLUOROETHANE, DICHLOROTRIFLUOROETHANE AND ETHANOL

[75] Inventors: Ellen L. Swan, Ransomville; Rajat S. Basu, Williamsville, both of N.Y.

[73] Assignee: Allied-Signal Inc., Morris Township, Morris County, N.J.

[21] Appl. No.: 330,252

[22] Filed: Mar. 29, 1989

[51] Int. Cl.$^4$ .......................... C11D 7/50; C11D 7/30
[52] U.S. Cl. ....................................... 252/171; 134/12; 134/38; 134/39; 134/40; 252/162; 252/170; 252/172; 252/364; 252/DIG. 9
[58] Field of Search ............... 252/162, 170, 171, 172, 252/364, DIG. 9; 134/12, 38, 39, 40

[56] References Cited

U.S. PATENT DOCUMENTS

| | | | |
|---|---|---|---|
| 3,936,387 | 2/1976 | Reusser | 252/171 |
| 4,035,258 | 7/1977 | Reusser | 252/171 |
| 4,035,258 | 7/1977 | Reusser | 252/171 |
| 4,816,174 | 3/1989 | Lund | 252/171 |

*Primary Examiner*—Paul Lieberman
*Assistant Examiner*—Kathleen Markowski
*Attorney, Agent, or Firm*—Jay P. Friedenson

[57] ABSTRACT

Azeotrope-like compositions comprising 1,1-dichoro-1-fluoroethane, dichlorotrifluoroethane and ethanol are stable and have utility as degreasing agents and as solvents in a variety of industrial cleaning applications including cold cleaning and defluxing of printed circuit boards.

18 Claims, No Drawings

AZEOTROPE-LIKE COMPOSITIONS OF 1,1-DICHLORO-1-FLUOROETHANE, DICHLOROTRIFLUOROETHANE AND ETHANOL

CROSS-REFERENCE TO RELATED APPLICATIONS

Co-pending, commonly assigned application Ser. No. 204,340, filed 06/09/88, discloses azeotrope-like mixtures of 1,1-dichloro-1-fluoroethane and ethanol.

Co-pending, commonly assigned application Ser. No. 297,467, filed 01/17/89, which is a continuation-in-part of application Ser. No. 290,124, filed 12/27/88, discloses azeotrope-like mixtures of 1,1-dichloro-1-fluoroethane, dichlorotrifluoroethane and methanol.

DESCRIPTION

Field of the Invention

This invention relates to azeotrope-like or essentially constant boiling mixtures of 1,1-dichloro-1-fluoroethane, dichlorotrifluoroethane and ethanol. These mixtures are useful in a variety of vapor degreasing, cold cleaning and solvent cleaning applications including defluxing.

BACKGROUND OF THE INVENTION

Vapor degreasing and solvent cleaning with fluorocarbon based solvents have found widespread use in industry for the degreasing and otherwise cleaning of solid surfaces, especially intricate parts and difficult to remove soils.

In its simplest form, vapor degreasing or solvent cleaning consists of exposing a room temperature object to be cleaned to the vapors of a boiling solvent. Vapors condensing on the object provide clean distilled solvent to wash away grease or other contamination. Final evaporation of solvent from the object leaves behind no residue as would be the case where the object is simply washed in liquid solvent.

For difficult to remove soils where elevated temperature is necessary to improve the cleaning action of the solvent, or for large volume assembly line operations where the cleaning of metal parts and assemblies must be done efficiently and quickly, the conventional operation of a vapor degreaser consists of immersing the part to be cleaned in a sump of boiling solvent which removes the bulk of the soil, thereafter immersing the part in a sump containing freshly distilled solvent near room temperature, and finally exposing the part to solvent vapors over the boiling sump which condense on the cleaned part. In addition, the part can also be sprayed with distilled solvent before final rinsing.

Vapor degreasers suitable in the above-described operations are well known in the art. For example, Sherliker et al. in U.S. Pat. No. 3,085,918 disclose such suitable vapor degreasers comprising a boiling sump, a clean sump, a water separator, and other ancillary equipment.

Cold cleaning is another application where a number of solvents are used. In most cold cleaning applications the soiled part is either immersed in the fluid or wiped with rags or similar objects soaked in solvents and allowed to air dry.

Fluorocarbon solvents, such as trichlorotrifluoroethane, have attained widespread use in recent years as effective, nontoxic, and nonflammable agents useful in degreasing applications and other solvent cleaning applications. Trichlorotrifluoroethane has been found to have satisfactory solvent power for greases, oils, waxes and the like. It has therefore found widespread use for cleaning electric motors, compressors, heavy metal parts, delicate precision metal parts, printed circuit boards, gyroscopes, guidance systems, aerospace and missile hardware, aluminum parts and the like.

The art has looked towards azeotropic compositions including the desired fluorocarbon components such as trichlorotrifluoroethane which include components which contribute additionally desired characteristics, such as polar functionality, increased solvency power, and stabilizers. Azeotropic compositions are desired because they do not fractionate upon boiling. This behavior is desirable because in the previously described vapor degreasing equipment with which these solvents are employed, redistilled material is generated for final rinse-cleaning. Thus, the vapor degreasing system acts as a still. Unless the solvent composition exhibits a constant boiling point, i.e., is an azeotrope or is azeotrope-like, fractionation will occur and undesirable solvent distribution may act to upset the cleaning and safety of processing. Preferential evaporation of the more volatile components of the solvent mixtures, which would be the case if they were not an azeotrope or azeotrope-like, would result in mixtures with changed compositions which may have less desirable properties, such as lower solvency towards soils, less inertness towards metal, plastic or elastomer components, and increased flammability and toxicity.

The art is continually seeking new fluorocarbon based azeotropic mixtures or azeotrope-like mixtures which offer alternatives for new and special applications for vapor degreasing and other cleaning applications. Currently, of particular interest, are such azeotrope-like mixtures which are based on fluorocarbons which are considered to be stratospherically safe substitutes for presently used fully halogenated chlorofluorocarbons. The latter are suspected of causing environmental problems in connection with the earth's protective ozone layer. Mathematical models have substantiated that hydrochlorofluorocarbons, such as 1,1-dichloro-1-fluoroethane (HCFC-141b) and dichlorotrifluoroethane (HCFC-123 or HCFC-123a), will not adversely affect atmospheric chemistry, being negligible contributors to ozone depletion and to green-house global warming in comparison to the fully halogenated species.

U.S. Pat. No. 3,936,387 discloses the azeotropic composition of methanol with 1,2-dichloro-1-fluoroethane (HCFC-141) U.S. Pat. No. 4,035,258 discloses the azeotropic composition of ethanol with HCFC-141.

It is an object of this invention to provide novel azeotrope-like compositions based on HCFC-141b and dichlorotrifluoroethane which are liquid at room temperature and which will not fractionate under the process of distillation or evaporation, which are useful as solvents for use in vapor degreasing and other solvent cleaning applications including defluxing applications.

Another object of the invention is to provide novel environmentally acceptable solvents for use in the aforementioned applications.

Other objects and advantages of the invention will become apparent from the following description.

DESCRIPTION OF THE INVENTION

In accordance with the invention, novel azeotrope-like compositions have been discovered comprising HCFC-141b, dichlorotrifluoroethane and ethanol. The dichlorotrifluoroethane component can be either of its isomers 1,1-dichloro-2,2,2-trifluoroethane (HCFC-123) or 1,2-dichloro-1,2,2-trifluoroethane (HCFC-123a), or mixtures thereof. The preferred isomer is HCFC-123.

Dichlorotrifluoroethane and HCFC-141b do not form binary azeotrope systems. HCFC-141, dichlorotrifluoroethane and methanol do not form a ternary azeotropic system. HCFC-141, dichlorotrifluoroethane and ethanol are not known to form a ternary azeotropic system.

The azeotrope-like compositions of the invention comprise from about 62.5 to about 94.9 weight percent of HCFC-141b, from about 3.0 to about 35.5 weight percent of dichlorotrifluoroethane and from about 0.1 to about 3.0 weight percent of ethanol.

In a preferred embodiment of the invention, the azeotrope-like compositions of the invention comprise from about 72 to about 94.7 weight percent of HCFC-141b, from about 5 to about 26.0 weight percent of dichlorotrifluoroethane and from about 0.3 to about 2.0 weight percent of ethanol.

In a still more preferred embodiment of the invention, the azeotrope-like compositions of the invention comprise from about 75 to about 90 weight percent of HCFC-141b, from about 8.0 to about 24.7 weight percent of dichlorotrifluoroethane and from about 0.3 to about 1.5 weight percent of ethanol.

In the most preferred embodiment of the invention, the azeotrope-like compositions of the invention comprise from about 77.2 to about 90.3 weight percent HCFC-141b, about 8.1 to about 21.7 weight percent dichlorotrifluoroethane and about 0.5 to about 2.0 weight percent ethanol which exhibits a boiling point of about 31.8° C. at 760 mm Hg.

The azeotrope-like compositions of the invention containing a mixture of HCFC-123 and HCFC-123a behave as an azeotrope-like composition because the separate ternary azeotropic compositions with HCFC-123 and HCFC-123a have boiling points so close to one another as to be indistinguishable for practical purposes.

The precise or true azeotrope compositions have not been determined but have been ascertained to be within the indicated ranges. Regardless of where the true azeotropes lie, all compositions within the indicated ranges, as well as certain compositions outside the indicated ranges, are azeotrope-like, as defined more particularly below.

It has been found that these azeotrope-like compositions are on the whole nonflammable liquids, i.e. exhibit no flash point when tested by the Tag Open Cup test method—ASTM D 1310-86.

From fundamental principles, the thermodynamic state of a fluid is defined by four variables: pressure, temperature, liquid composition and vapor composition, or P-T-X-Y, respectively. An azeotrope is a unique characteristic of a system of two or more components where X and Y are equal at the stated P and T. In practice, this means that the components of a mixture cannot be separated during distillation, and therefore are useful in vapor phase solvent cleaning as described above.

For the purpose of this discussion, by azeotrope-like composition is intended to mean that the composition behaves like a true azeotrope in terms of its constant boiling characteristics or tendency not to fractionate upon boiling or evaporation. Such composition may or may not be a true azeotrope. Thus, in such compositions, the composition of the vapor formed during boiling or evaporation is identical or substantially identical to the original liquid composition. Hence, during boiling or evaporation, the liquid composition, if it changes at all, changes only to a minimal or negligible extent. This is to be contrasted with non-azeotrope-like compositions in which during boiling or evaporation, the liquid composition changes to a substantial degree.

Thus, one way to determine whether a candidate mixture is "azeotrope-like" within the meaning of this invention, is to distill a sample thereof under conditions (i.e. resolution-number of plates) which would be expected to separate the mixture into its separate components. If the mixture is non-azeotropic or non-azeotrope-like, the mixture will fractionate, i.e. separate into its various components with the lowest boiling component distilling off first, and so on. If the mixture is azeotrope-like, some finite amount of a first distillation cut will be obtained which contains all of the mixture components and which is constant boiling or behaves as a single substance. This phenomenon cannot occur if the mixture is not azeotrope-like i.e., it is not part of an azeotropic system. If the degree of fractionation of the candidate mixture is unduly great, then a composition closer to the true azeotrope must be selected to minimize fractionation. Of course, upon distillation of an azeotrope-like composition such as in a vapor degreaser, the true azeotrope will form and tend to concentrate.

It follows from the above that another characteristic of azeotrope-like compositions is that there is a range of compositions containing the same components in varying proportions which are azeotrope-like. All such compositions are intended to be covered by the term azeotrope-like as used herein. As an example, it is well known that at differing pressures, the composition of a given azeotrope will vary at least slightly as does the boiling point of the composition. Thus, an azeotrope of A and B represents a unique type of relationship but with a variable composition depending on temperature and/or pressure. Accordingly, another way of defining azeotrope-like within the meaning of this invention is to state that such mixtures boil within about ±0.5° C. (at about 760 mm Hg) of the boiling point of the most preferred compositions disclosed herein, i.e. 31.8° C. at 760 mm Hg. When the dichlorotrifluoroethane component is 1,1-dichloro-1,2,2-trifluoroethane, the preferred mixtures boil within about ±0.5° C. (at about 760 mm Hg) of 32.0° C. When the dichlorotrifluoroethane component is 1,1-dichloro-2,2,2-trifluoroethane, the preferred mixtures boil within about ±0.5° C. (at about 760 mm Hg) of 31.6° C. As is readily understood by persons skilled in the art, the boiling point of the azeotrope will vary with the pressure.

In the process embodiment of the invention, the azeotrope-like compositions of the invention may be used to clean solid surfaces by treating said surfaces with said compositions in any manner well known to the art such as by dipping or spraying or use of conventional degreasing apparatus.

The HCFC-141b, dichlorotrifluoroethane and ethanol components of the novel solvent azeotrope-like compositions of the invention are known materials. Preferably they should be used in sufficiently high purity so as to avoid the introduction of adverse influences upon the solvency properties or constant boiling properties of the system.

Of the possible binary combinations of the three components which form the azeotrope-like mixtures of this invention, only one is known to form an azeotrope: HCFC-141b and ethanol (31.9° C. boiling point at 765 mm Hg), a minimum boiling azeotrope. Neither HCFC-141b and HCFC-123 nor HCFC-123 and ethanol form binary azeotropes.

The advantages of the ternary systems over the binary azeotrope, HCFC-141b/ethanol, are: (a) decreased vapor flammability in comparison to HCFC-141b/ethanol, and (b) lower ozone depletion potential compared to HCFC-141b/ethanol.

EXAMPLES 1–4

These examples confirm the existence of azeotrope-like mixtures between 1,1-dichloro-1-fluoroethane, ethanol and dichlorotrifluoroethane via the method of distillation. These examples also illustrate that these mixtures do not fractionate during distillation.

A 5-plate Oldershaw distillation column with a cold water condensed automatic liquid dividing head was used for these examples. The distillation column was charged with the below indicated starting mixture which was heated under total reflux for about an hour to ensure equilibration. A reflux ratio of 2:1 was employed for the distillation. Approximately 50 percent of the original charges were collected in four similar-sized overhead fractions. The compositions of these fractions were analyzed using gas chromatrography. Table I shows the compositions of the starting material, the distillate fractions and the boiling points of the constant boiling fractions. The averages of the distillate fractions and the overhead temperatures are quite constant within the uncertainty associated with determining the compositions, indicating that the mixtures are constant boiling or azeotrope-like.

TABLE 1

| Starting Material (WT. %) | | | | |
|---|---|---|---|---|
| Example | HCFC-141b | HCFC-123 | HCFC-123a | ETOH |
| 1 | 88.90 | 10.07 | — | 1.03 |
| 2 | 74.18 | 24.80 | — | 1.02 |
| 3 | 89.11 | — | 9.89 | 1.00 |
| 4 | 74.26 | — | 24.72 | 1.02 |

| Distillate Fractions (WT. %) | | | | |
|---|---|---|---|---|
| Example | HCFC-141b | HCFC-123 | HCFC-123a | ETOH |
| 1 | 87.5 | 11.12 | — | 1.38 |
| 2 | 71.05 | 27.95 | — | 1.00 |
| 3 | 88.55 | — | 10.22 | 1.23 |
| 4 | 73.26 | — | 25.72 | 1.02 |

| Example | Boiling Point (°C.) | Barometric Pressure (mm Hg) | Boiling Point (°C.) Corrected to 760 mm Hg |
|---|---|---|---|
| 1 | 30.5 | 740 | 31.3 |
| 2 | 31.0 | 740 | 31.8 |
| | | mean | 31.6 |
| 3 | 31.1 | 748 | 31.7 |
| 4 | 31.8 | 748 | 32.3 |
| | | mean | 32.0 |

The compositions of the invention are useful as solvents in a variety of vapor degreasing, cold cleaning and solvent cleaning applications including defluxing.

It is known in the art that the use of more active solvents, such as lower alkanols in combination with certain halocarbons such as trichlorotrifluoroethane, may have the undesirable result of attacking reactive metals such as zinc and aluminum, as well as certain aluminum alloys and chromate coatings such as are commonly employed in circuit board assemblies. The art has recognized that certain stabilizers, such as nitromethane, are effective in preventing metal attack by chlorofluorocarbon mixtures with such alkanols. Other candidate stabilizers for this purpose, such as disclosed in the literature, are secondary and tertiary amines, olefins and cycloolefins, alkylene oxides, sulfoxides, sulfones, nitrites and nitriles, and acetylenic alcohols or ethers. It is contemplated that such stabilizers as well as other additives may be combined with the azeotrope-like compositions of this invention.

What is claimed is:

1. Azeotrope-like compositions consisting essentially of from about 62.5 to about 94.9 weight percent 1,1-dichloro-1-fluoroethane, from about 3.0 to about 35.5 weight percent dichlorotrifluoroethane selected from the group consisting of 1,2-dichloro-1,2,2-trifluoroethane, 1,1-dichloro-2,2,2,-trifluoroethane or mixtures thereof and from about 0.1 to about 3.0 weight percent ethanol wherein the composition with 1,2,-dichloro-1,2,2-trifluoroethane boils at about 32.0° C.±0.5° C. at 760 mm Hg, the composition with 1,1-dichloro-2,2,2-trifluoroethane boils at about 31.6° C.±0.5° C. at 760 mm Hg and the composition with mixtures of the dichlorotrifluoroethanes boils at about 31.8° C.±0.5° C. at 760 mm Hg.

2. Azeotrope-like compositions according to claim 1 wherein said dichlorotrifluoroethane is 1,2-dichloro-1,2,2-trifluoroethane.

3. Azeotrope-like compositions according to claim 1 wherein said dichlorotrifluoroethane is 1,1-dichloro-2,2,2-trifluoroethane.

4. Azeotrope-like compositions according to claim 1 consisting essentially of from about 72.0 to about 94.7 weight percent 1,1-dichloro-1-fluoroethane, from about 5.0 to about 26.0 weight percent dichlorotrifluoroethane and from about 0.3 to about 2.0 weight percent ethanol.

5. Azeotrope-like compositions according to claim 1 consisting essentially of from about 75.0 to about 90.0 weight percent 1,1-dichloro-1-fluoroethane, from about 8.0 to about 24.7 weight percent dichlorotrifluoroethane and from about 0.3 to about 1.5 weight percent ethanol.

6. Azeotrope-like compositions according to claim 1 consisting essentially of about 77.2 to about 90.3 weight percent 1,1-dichloro-1-fluoroethane, about 8.1 to about 21.7 weight percent dichlorotrifluoroethane and about 0.5 to about 1.5 weight percent ethanol.

7. Azeotrope-like compositions according to claim 6 wherein said dichlorotrifluoroethane is 1,2-dichloro-1,2,2-trifluoroethane.

8. Azeotrope-like compositions according to claim 6 wherein said dichlorotrifluoroethane is 1,1-dichloro-2,2,2-trifluoroethane.

9. Azeotrope-like compositions consisting essentially of 1,1-dichloro-1-fluoroethane, dichlorotrifluoroethane selected from the group consisting of 1,2-dichloro-1,2,2-trifluoroethane, 1,1-dichloro-2,2,2,-trifluoroethane or mixtures thereof and ethanol wherein the composition with 1,2-dichloro-1,2,2-trifluoroethane boils at about 32.0° C.±0.5° C. at 760 mm Hg, the composition with 1,1-dichloro-2,2,2-trifluoroethane boils at about 31.6° C.±0.5° C. at 760 mm Hg and the composition with mixtures of the dichlorotrifluoroethanes boils at about 31.8° C.±0.5° C. at 760 mm Hg.

10. Azeotrope-like compositions according to claim 9 wherein said dichlorotrifluoroethane is 1,2-dichloro-1,2,2-trifluoroethane which boil at about 32.0° C.±0.5° C. at 760 mm Hg.

11. Azeotrope-like compositions according to claim 9 wherein said dichlorotrifluoroethane is 1,1-dichloro-2,2,2-trifluoroethane which boil at about 31.6° C.±0.5° C. at 760 mm Hg.

12. The method of cleaning a solid surface which comprises treating said surface with an azeotrope-like composition as defined in claim 1.

13. The method of cleaning a solid surface which comprises treating said surface with an azeotrope-like composition as defined in claim 2.

14. The method of cleaning a solid surface which comprises treating said surface with an azeotrope-like composition as defined in claim 3.

15. The method of cleaning a solid surface which comprises treating said surface with an azeotrope-like composition as defined in claim 4.

16. The method of cleaning a solid surface which comprises treating said surface with an azeotrope-like composition as defined in claim 9.

17. The method of cleaning a solid surface which comprises treating said surface with an azeotrope-like composition as defined in claim 10.

18. The method of cleaning a solid surface which comprises treating said surface with an azeotrope-like composition as defined in claim 11.

* * * * *